United States Patent
Castillo Garcia et al.

(10) Patent No.: US 7,948,762 B2
(45) Date of Patent: May 24, 2011

(54) WIRING SYSTEM WITH INTEGRATED ELECTRONICS

(75) Inventors: Marta Castillo Garcia, Burgos (ES); Miguel Angel Herrero Perez, Burgos (ES)

(73) Assignee: Grupo Antolin-Ingenieria, S.A., Burgos (ES)

( * ) Notice: Subject to any disclaimer, the term of this patent is extended or adjusted under 35 U.S.C. 154(b) by 544 days.

(21) Appl. No.: 12/027,751

(22) Filed: Feb. 7, 2008

(65) Prior Publication Data

US 2009/0122509 A1    May 14, 2009

(51) Int. Cl.
    *H05K 1/00*    (2006.01)
(52) U.S. Cl. ........ 361/749; 361/792; 361/728; 174/250; 174/255
(58) Field of Classification Search .................. 361/749, 361/792, 683, 728, 748; 174/250, 255; 439/70, 439/71
    See application file for complete search history.

(56) References Cited

U.S. PATENT DOCUMENTS

| | | | |
|---|---|---|---|
| 6,088,241 A | 7/2000 | Hülsmann et al. | |
| 6,583,990 B2 * | 6/2003 | Serizawa et al. | 361/749 |
| 7,419,237 B2 * | 9/2008 | Suzuki | 347/18 |
| 7,446,261 B2 * | 11/2008 | Kumar et al. | 174/254 |
| 2007/0125003 A1 * | 6/2007 | Wartzack et al. | 49/502 |

FOREIGN PATENT DOCUMENTS

| | | |
|---|---|---|
| DE | 201 16 828 U1 | 2/2002 |
| EP | 1 383 215 A1 | 1/2004 |
| JP | 2-117191 A | 5/1990 |
| JP | 2000-197250 A | 7/2000 |
| JP | 2001-189577 A | 7/2001 |

* cited by examiner

*Primary Examiner* — Yuriy Semenenko
*Assistant Examiner* — Andargie M Aychillhum
(74) *Attorney, Agent, or Firm* — Sughrue Mion, PLLC

(57) ABSTRACT

Wiring system which comprises: a flexible printed circuit board (1) with a surface (2) in turn comprising one or more electrical circuits formed by conductive strips (4) and a plurality of electronic components (5) connected to said conductive strips (4) and with at least one extension or branch (6) extending directly from said surface (2) and also comprising conductive strips (7); characterized in that it further comprised: at least one flexible flat cable (8) joined to said at least one extension or branch (6), such that an electrical connection is formed between said flexible flat cable (8) and said extension or branch (6). A vehicle door which internally comprises this wiring system.

17 Claims, 7 Drawing Sheets

WIRING SYSTEM WITH INTEGRATED ELECTRONICS

FIELD OF THE INVENTION

The present invention belongs to the field of wiring and connection systems comprising electronic components, and more specifically to wiring and connection systems comprising electronic components to be installed in vehicles.

BACKGROUND OF THE INVENTION

Vehicles today incorporate a large number of electronic components useful to operate, activate or control many devices. For example, electronic components in an automobile door can control the operation of the windows, locks, speakers or lights. Several components for controlling the devices located in the vehicle are also incorporated in the dashboard, such as data displays (speed, temperature, state of the lights, etc.), music equipment control, telephone, clock, activation of the various switches or buttons, etc.

The electronic components are usually arranged on a rigid integrated circuit board (Printed Circuit Board, PCB) which is housed inside a protective casing, such as a rigid plastic casing, or inside a part so that said board is always protected. The aforementioned casing is usually provided with a series of connectors allowing the connection of the corresponding electrical cables extended to the equipment that is to be controlled.

However, rigid integrated circuit boards or PCBs have a series of drawbacks: On one hand, they occupy a large space, which is a great drawback in the event of integration in vehicles, in which the available space is very limited. On the other hand, since PCBs are rigid, they need a planar base for their attachment. For example, the support surfaces in a door or dashboard usually include curved or stepped areas where a planar PCB board cannot be directly attached, rather configurations are required so that the board can be supported on the same plane or the board must be broken up into several segments. For the same reason, the use of this type of boards in the ceiling of vehicles, for example in light consoles, is conditioned by the lack of space. So as to not take up usable space, these designs must include deep-drawings to house the board. The rigid casing furthermore takes up a certain volume or thickness, such casing usually being formed by two halves which are joined together, for example, by snap-fitting. The manufacture of both parts and the subsequent assembly, which casing internally houses the PCB, has a relatively high cost. Finally, the weight of the assembly is relatively high, which is a serious problem in the automotive field because weight savings entails fuel savings and reduced pollution.

To solve these drawbacks some vehicles incorporate flexible printed circuits (FPC) on which the corresponding electronic components are assembled. This type of printed boards is implemented on a flexible printed circuit board which is formed by a substrate, which is usually a plastic sheet on which a sheet of metal, such as copper, is deposited, on which sheet of metal the necessary electrical strips or paths are formed by means of etching. Later on a protection sheet is added.

Patent document U.S. Pat. No. 6,088,241-A describes a connection system for automobiles using flexible printed circuit (FPC) technology. This patent document describes a flexible printed circuit board having two parts: a part on which the necessary conductive strips are formed and on which the different active or passive elements, such as integrated circuits, resistors, etc., are formed, and a part without electronic components, on which the conductive strips designed to be connected to the different devices of the vehicle to be controlled are formed. As a result of the flexibility of the flexible printed circuit board (FPC), it is possible to adapt it to the curve of the vehicle door in question. As indicated in U.S. Pat. No. 6,088,241-A, several of these flexible printed circuit boards are manufactured on a single substrate surface, each connection system being separated by means of perforated lines that allow them to be easily separated. To facilitate the coupling to curved surfaces such as that of a vehicle door, the part of the board on which the conductive strips are formed incorporates fold lines that can be folded as needed in order to fold the board and make the end of each conductive strip match up with the device they are going to be connected to and to adapt the assembly to the shape of the door.

However, the connection system provided by U.S. Pat. No. 6,088,241-A has a series of drawbacks: First, incorporating both the part with the electronic components and the conductive connection lines for the connection with the remote devices on the same flexible board entails a huge economic expense, since the manufacture of flexible boards has a high cost. Furthermore, their manufacture may require a specific design for each application since the end of the conductive strips must match up with each device that each of said conductive strips is to be connected to. Additionally, since it is a relatively large board on which as many electronic components as conductive strips are placed, there are frequently problems with the dimensional tolerances of the board and with the position of said electronic components on it. Finally, even though flexible printed circuits (FPC) provide certain capacity to adapt to curved surfaces due to the previously mentioned fold lines, the manipulation that must be carried out to fold them may damage the electronic components, making the board extremely sensitive.

German utility model DE-20116828-U1 describes an electrical connection system connecting several devices or functional areas constructed from a flexible connection board. The system described in DE-20116828-U1 has the same problems as the connector of U.S. Pat. No. 6,088,241-A, since it requires a large flexible board, having a specific design for each application and limited by the dimensions and design of the structure on which it is incorporated, and having a relatively high manufacturing cost.

Flexible flat cables such as those described in EP-1383215-A1, which have been used in the automotive industry, are additionally known.

SUMMARY OF THE INVENTION

The present invention solves the aforementioned drawbacks by means of a small wiring system, which is easy and economical to manufacture, easily integrated in areas where there is little space and lightweight.

In one aspect of the present invention, a wiring system formed by a flexible printed circuit board (FPC board) and one or more flexible flat cables is provided. The flexible printed circuit board comprises a surface in turn comprising one or more electrical circuits formed by conductive strips and a plurality of electronic components connected to said conductive strips; and one or more extensions or branches extending directly from said surface and also comprising conductive strips. The flexible flat cables are joined to these extensions or branches into which the surface is extended such that an electrical connection is formed between the flexible flat cable and the extension or branch.

Each of said flexible flat cables is preferably of variable length.

In a particular embodiment of the present invention, at least one of the flexible flat cables has a connector connected at the end opposite to the end joined to the corresponding extension or branch.

In a particular embodiment of the present invention, at least one of the flexible flat cables has a flexible printed circuit board connected at the end opposite to the end joined to the corresponding extension or branch.

In a particular embodiment, at least one extension or branch is not connected to any flexible flat cable.

The electrical connection between each extension or branch and each flexible flat cable is carried out by means of simple connectors providing electrical and mechanical connection simultaneously. Said electrical connection is preferably carried out by means of a method chosen from the following group: crimping, welding, gluing and the combination of any of the latter. This electrical connection is optionally protected by a layer of insulating element.

The width of at least one extension or branch is optionally equal to the width of the corresponding flexible flat cable.

The spacing between the conductive strips of each extension or branch is preferably equal to the spacing between the conductive strips of the corresponding flexible flat cable.

Optionally there are unused conductive strips in at least one extension or branch.

At least one extension or branch, also optionally, comprises conductive strips having different widths. Alternatively, all the conductive strips substantially have the same width in at least one extension or branch.

When at least one extension or branch is connected with a flexible flat cable, the connected conductive strips preferably have the same width.

The flexible printed circuit board is preferably encapsulated in an insulating element.

In a particular embodiment, the wiring system is designed to be installed inside a vehicle, preferably in the paneling of the inside of a vehicle, in the paneling of a vehicle door, pillar or ceiling, or in a tray, dashboard, seat, or module carrying of a vehicle door.

The present invention also provides a vehicle door internally comprising a wiring system as previously indicated.

In the context of the present invention, the terms "approximately" and "substantially" must be understood as indicative of values close to those accompanied by such terms. A person skilled in the art will understand that a small deviation from the indicated values, within reasonable terms, is unavoidable due to measurement imprecision, implementation, etc.

Throughout this specification the term "comprises" and its derivatives must not be interpreted as being excluding or limiting, i.e. they must not be interpreted in the sense that they exclude the possibility that the element or concept referred includes additional elements or steps.

DESCRIPTION OF THE DRAWINGS

To complement the description being made and for the purpose of aiding to better understand the features of the invention according to a preferred practical embodiment thereof, a set of drawings is attached as an integral part of said description which shows the following with an illustrative and non-limiting character.

DETAILED DESCRIPTION OF THE INVENTION

In the context of the present invention, flexible printed circuit board is understood as the assembly formed by a substrate, which is usually a plastic sheet on which a sheet of metal, such as copper, is deposited, on which sheet of metal the necessary electrical strips or paths are formed by means of etching. A protective sheet may then be placed.

Also, and despite the fact that the term "board" may mistakenly lead to understanding rigidness or inflexibility, the term "flexible board" must be interpreted as those boards which allow being folded without breaking due to their structural features. These flexible boards are known in the state of the art. Therefore, flexible printed circuit board is understood to be the flexible boards on which printed circuits are designed and manufactured.

Figure 1:
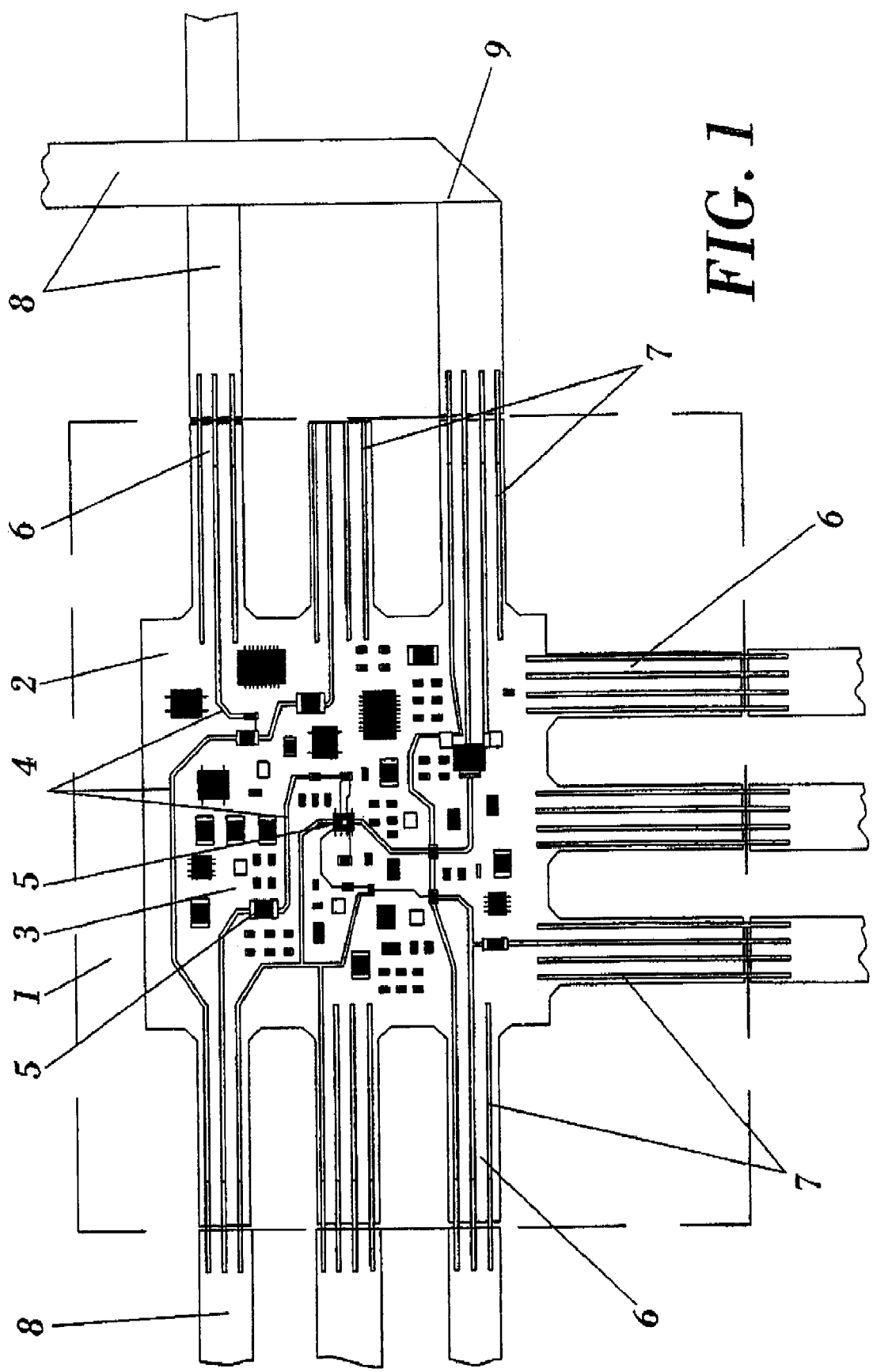
FIG. 1 shows a wiring system according to an embodiment of the present invention.

FIG. 1 shows a wiring system formed by a flexible printed circuit board (1) formed by a substrate, which is usually a plastic sheet. Non-limiting examples of materials that can act as a substrate are PET, PEN and PA. A layer of metal, preferably copper, is deposited on the substrate, although this layer of metal is not limited to copper. Alternatively, another metal could be used, such as silver. The electrical or conductive strips or paths necessary to form an electrical circuit are formed on this layer of metal. These electrical or conductive strips or paths are formed by means of photoimpression and are prepared or configured by means of conventional etching. A protective layer is then deposited, preferably of the same material as the substrate.

The flexible printed circuit board (1) is formed by two different areas:

A first area comprises a surface (2) on which one or more electrical circuits (3) formed by conductive strips (4) and a plurality of electronic components (5) connected to said conductive strips (4) are formed. As mentioned, these conductive strips (4) are obtained by conventional methods, such as etching.

A second area comprises one or several extensions, branches or appendages (6) extending directly from the surface (2). It must be emphasized that these extensions or branches (6) form part of the same flexible printed circuit board (1). In other words, the surface (2) and the extensions or branches (6) are manufactured from the same part or piece of flexible printed circuit board (1). The extensions or branches (6) also comprise conductive strips (7) that are also obtained by conventional methods, such as etching.

The assembly of the electronic components (5) on the flexible printed circuit board (1) is done according to conventional methods, such as by the insertion of the pins of the components traversing the flexible board (1) and subsequent fixing by means of a tin bath, by surface fixing of the pins (known as Surface Mount Device, SMD) which is a fixing by means of a paste in an oven, by fixing by means of points (known as "Ball Grid Array", BGA), etc.

The extensions or branches (6) can be strategically placed, taking into account the distribution of signals produced by the electrical circuits (3).

In FIG. 1 the surface (2) adopts a square or rectangular shape, but this shape is not limiting, but merely illustrative, therefore the surface (2) can have any other shape.

Figure 5:
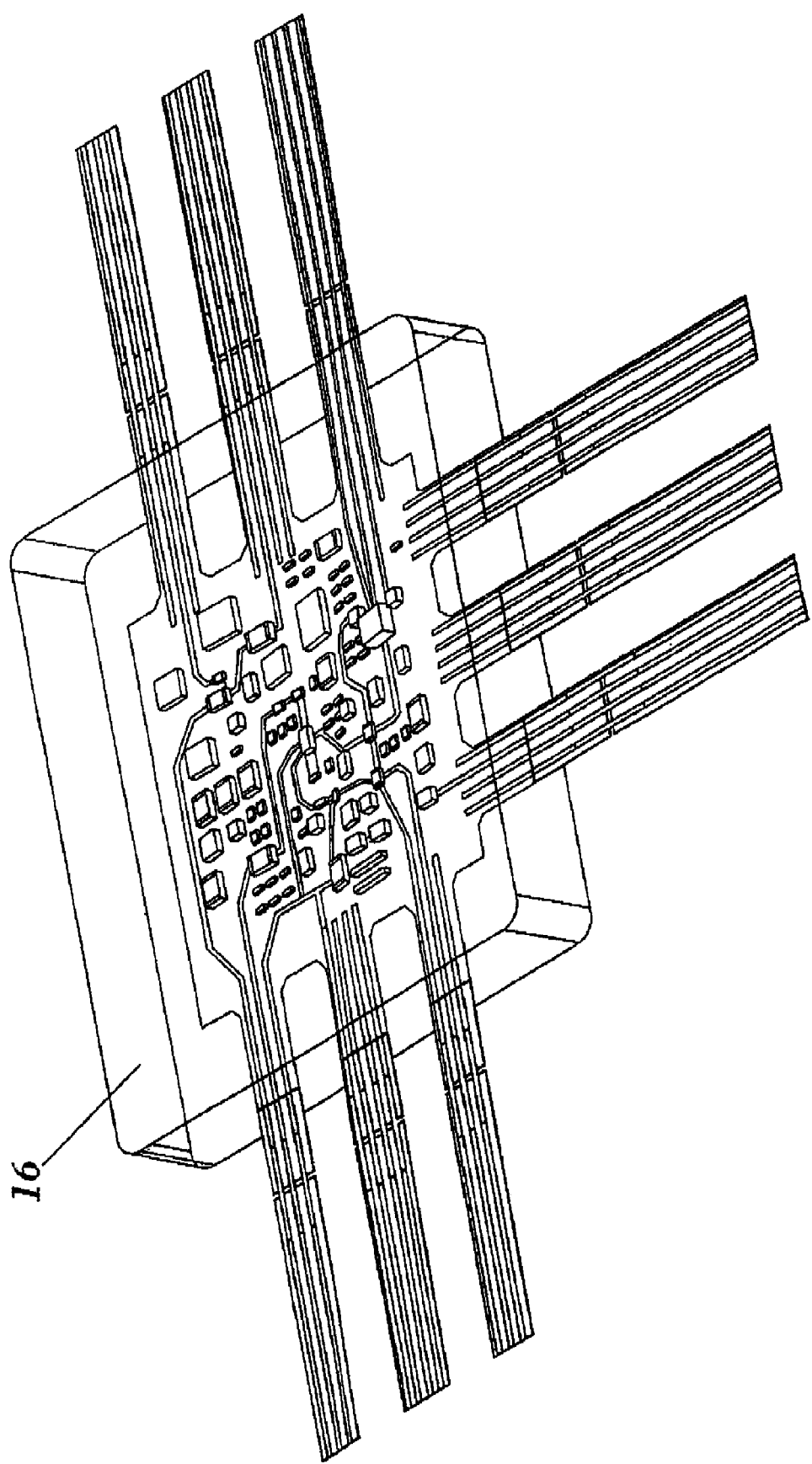
FIG. 5 shows a wiring system according to an embodiment of the present invention.

The flexible printed circuit board (1) is optionally wrapped or encapsulated in an insulating element (16), such as an insulating plastic, such as for example thermosetting resins, silicones, PES, PE, etc., by means of a conventional method, such as by overmolding. In this way, the flexible board (1) is insulated in the same way that rigid printed circuit boards (PCB) are insulated when they are placed inside a plastic casing. This is shown in FIG. 5, which shows a wiring system coated by an insulating element or encapsulated (16).

FIG. 1 also shows several cables (8) joined to some of the mentioned extensions or branches (6). Each joint between a cable (8) and an extension or branch (6) forms an electrical connection between the cable (8) and the extension (6).

The cables (8) are preferably flat flexible cables (FFC). The flat flexible cables can be, for example, laminated, such as PET, PEN, or extruded, such as PBT, TPU, PES and PUC. These flat flexible cables (8) are conventionally manufactured with a standard width and are provided in coils with a length consisting of many meters. For this reason, there is no limit imposing a certain length to the sections of flat cable (8) joined to the extensions or branches (6). The user can cut them to the desired width. There are two main manufacturing methods: by lamination or by extrusion. During the assembly of the wiring system of the present invention, the cables (8) are cut to the desired measurement according to the specific needs of the wiring system. The latter therefore acquires a great versatility and capacity of adaptation to several situations that are normally imposed by the equipment in which the wiring system is to be installed (vehicle doors, dashboard, ceilings, etc.)

Furthermore, since the cable is flexible, those sections of flat cable (8) which need to be folded for their adaptation to the structure or design of the element in which the wiring system is to be incorporated, can be bent or folded easily, without causing damage to the cable or to the flexible printed circuit board (1). FIG. 1 shows one of these folds (9).

Unlike other wiring systems, in which the joint between elements is carried out by means of rigid connectors which carry out the electrical and mechanical connection separately and which occupy considerable space, the joint between the flexible printed circuit board (1) and the flat cables (8), i.e. the joint between an extension or branch (6) and a piece of cable (8), is carried out without rigid connectors, by means of simple connectors, in which the same element (for example, welding or crimping clamp) carries out the electrical and mechanical connection. These simple connections are carried out by means of conventional methods, such as crimping, welding, gluing, the combination of any of the latter, etc. Unlike the connections achieved by means of rigid connectors, the joints in the present invention are substantially planar and have a small volume, therefore these joints have more surface continuity than those achieved with rigid connectors, occupying the same space. In short, in the context of the present invention "simple connectors" are those in which the same element allows the electrical and mechanical connection simultaneously.

The extensions or branches (6) do not have to have the same width as the flat cable (8), provided that the electric strips are correctly connected.

Figure 2:
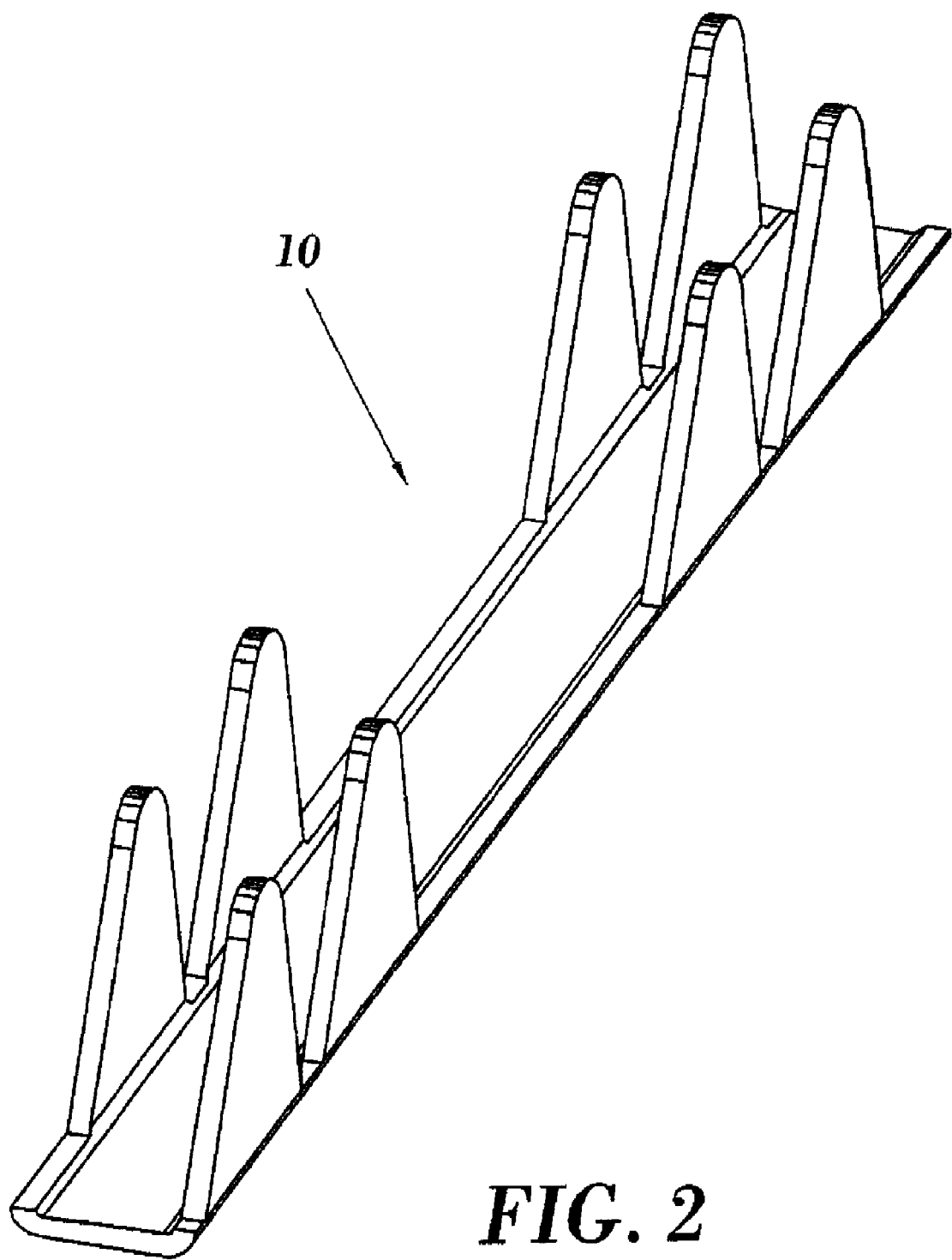
FIG. 2 shows a crimping clamp according to an embodiment of the present invention.
Figure 3:
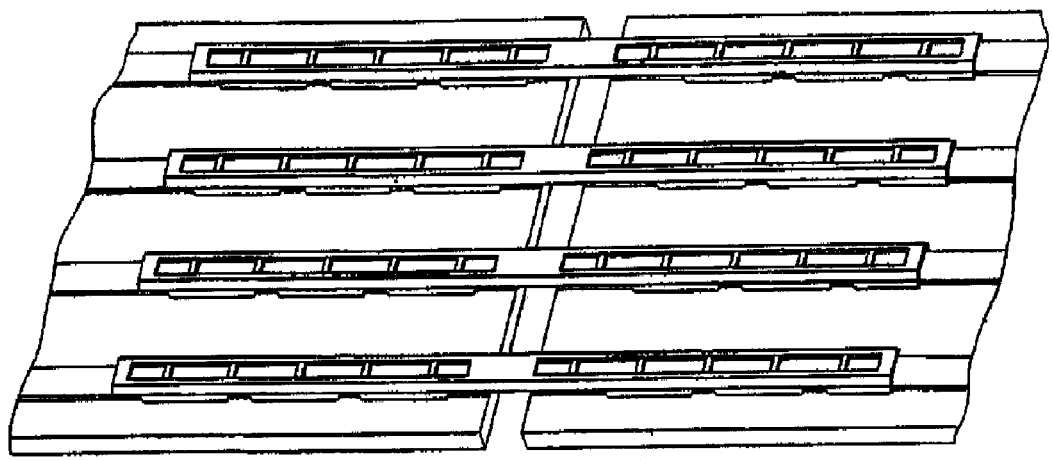
FIGS. 3 and 4 show a crimping joint seen from both sides of the cable according to embodiments of the present invention.
Figure 4:
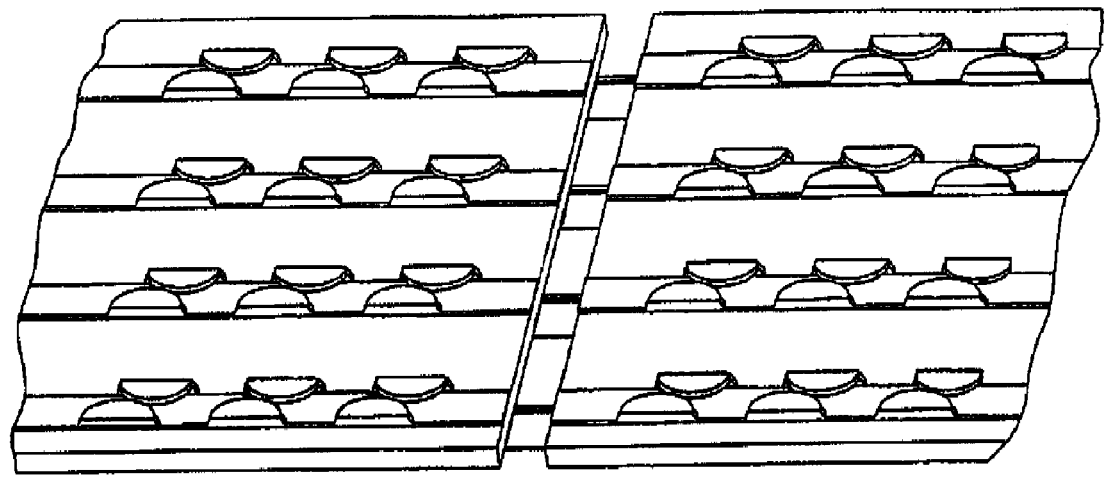

FIG. 2 shows an example of a conventional crimping clamp (10) that is used to join an extension or branch (6) and a piece of cable (8). This type of clamps must not be considered as limiting but merely illustrative. Crimping joints such as those shown in FIGS. 3 and 4 are achieved with the type of clamps (10) shown in FIG. 2. FIG. 3 shows the crimping joint of an extension or branch (6) and a piece of cable (8). FIG. 4 shows said crimping joint seen from the opposite part.

The joint between the extensions or branches (6) of the example of FIGS. 1 and 5 has been carried out by crimping.

Figure 6:
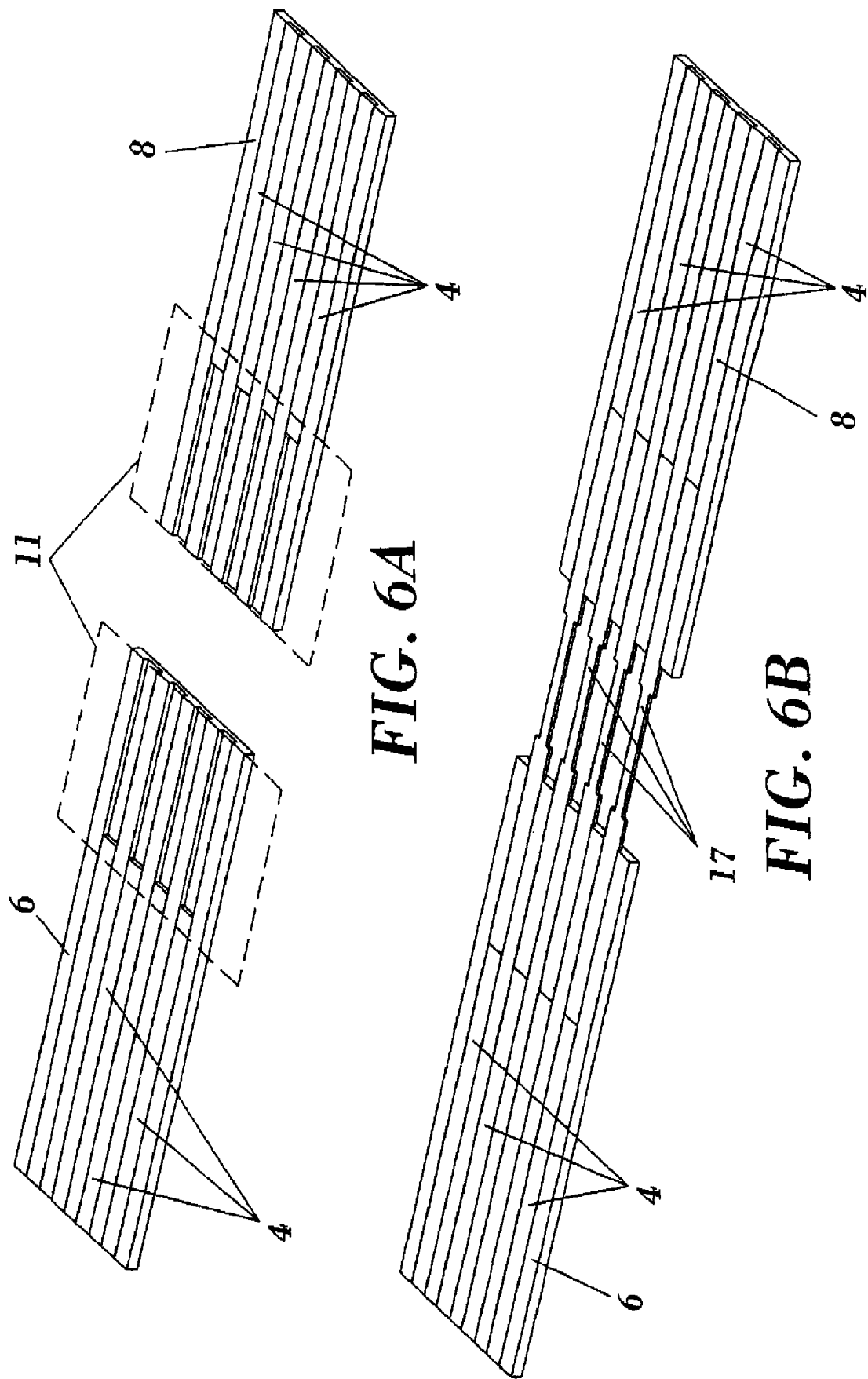
FIGS. 6A and 6B show in detail a possible embodiment of the welding joint between an extension or branch and a piece of cable.

As previously stated, the flexible board (1) can be coated with a protective sheet. The electrical connection between each extension or branch (6) and each flat flexible cable (8) can also be protected by means of a layer of an insulating element. When the joint is a crimping joint, it is not necessary to remove the protective sheet from the areas on which the clamp is to be placed. In other cases, it is necessary to leave a small area without a protective sheet so that a subsequent electrical contact can be formed between the conductive strips (4, 7) of said area and the cable (8). FIG. 6A shows these protective sheet-free areas (11), both in the extension or branch (6) and in the piece of cable (8). In other words, the conductive strips (4, 7) of both elements (6, 8) are exposed. The part of the cable (8) which is exposed is therefore bare, i.e. without a protective sheet. FIG. 6B shows how both elements (extension or branch (6) and cable (8)) are connected by means of the joint of both areas without an insulator (11). Said joint is formed by means of welding (12), preferably by means of a terminal (17). When the joint is a welding joint, the ends of both elements (6, 8) do not have to be in direct physical contact, but can be joined by means of a terminal (17) acting as a joint between both parts (6, 8).

The ends of the flat flexible cables (8) can have conventional rigid connectors, such that the cables (8) having connectors can be connected therethrough to several devices of the vehicle, for example. Alternatively, the cables (8) which do not have connectors can have at their end another flexible printed circuit board for a certain purpose. Electronic circuits or components are incorporated on said flexible board. This flexible board located at the end of a cable (8) opposite to the end at which the cable is joined to the main flexible printed circuit board (1) can be intended for the control of a certain device. Alternatively, a PCB type rigid board can also be connected at the end of one of these cables (8) by means of a suitable conventional connector.

Figure 7:
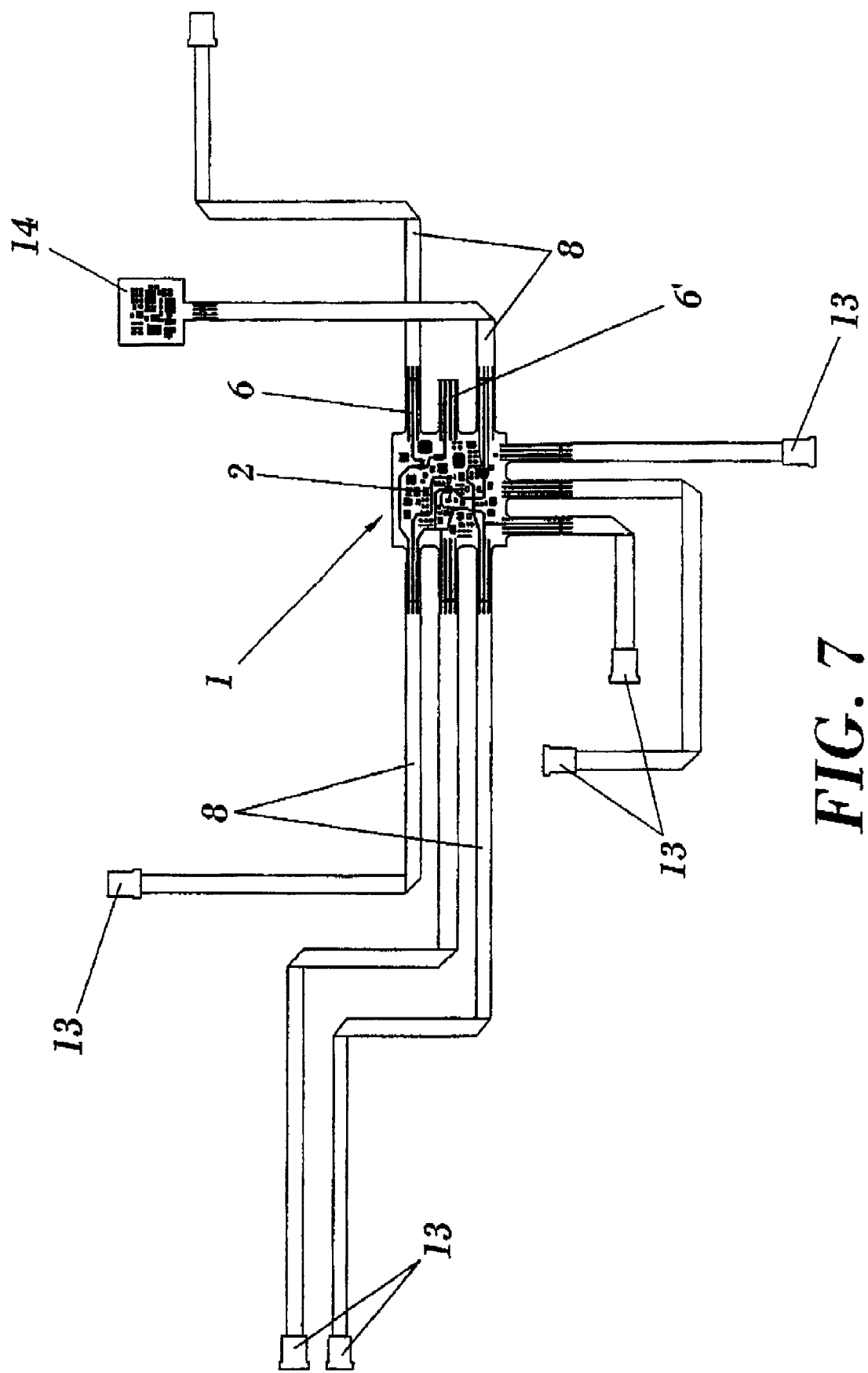
FIG. 7 shows a wiring system according to an embodiment of the present invention.

FIG. 7 shows an example of a wiring system according to the present invention. A flexible printed circuit board (1) can be seen in this system, said board comprising a surface (2) on which one or more electrical circuits are formed, made up of conductive strips and a plurality of electronic components and extensions or branches (6) joined to a series of flexible flat cables (8), as previously described. As can be seen, not all the extensions or branches (6) have to be joined to a cable (8), since connectivity is a design option and depends on the specific needs of each case. In this example, there is an extension or branch (6') not connected to a cable (8). Some of the cables (8) end in a connector (13), while others end in a flexible printed circuit board (14) for the control of a certain element or device. This flexible board (14) is structurally similar to the main flexible board (1): it comprises a surface on which the printed circuit is designed with its connecting lines and its electronic components and an extension or branch through which the flexible board (14) connects to the flat cable (8).

Figure 8:
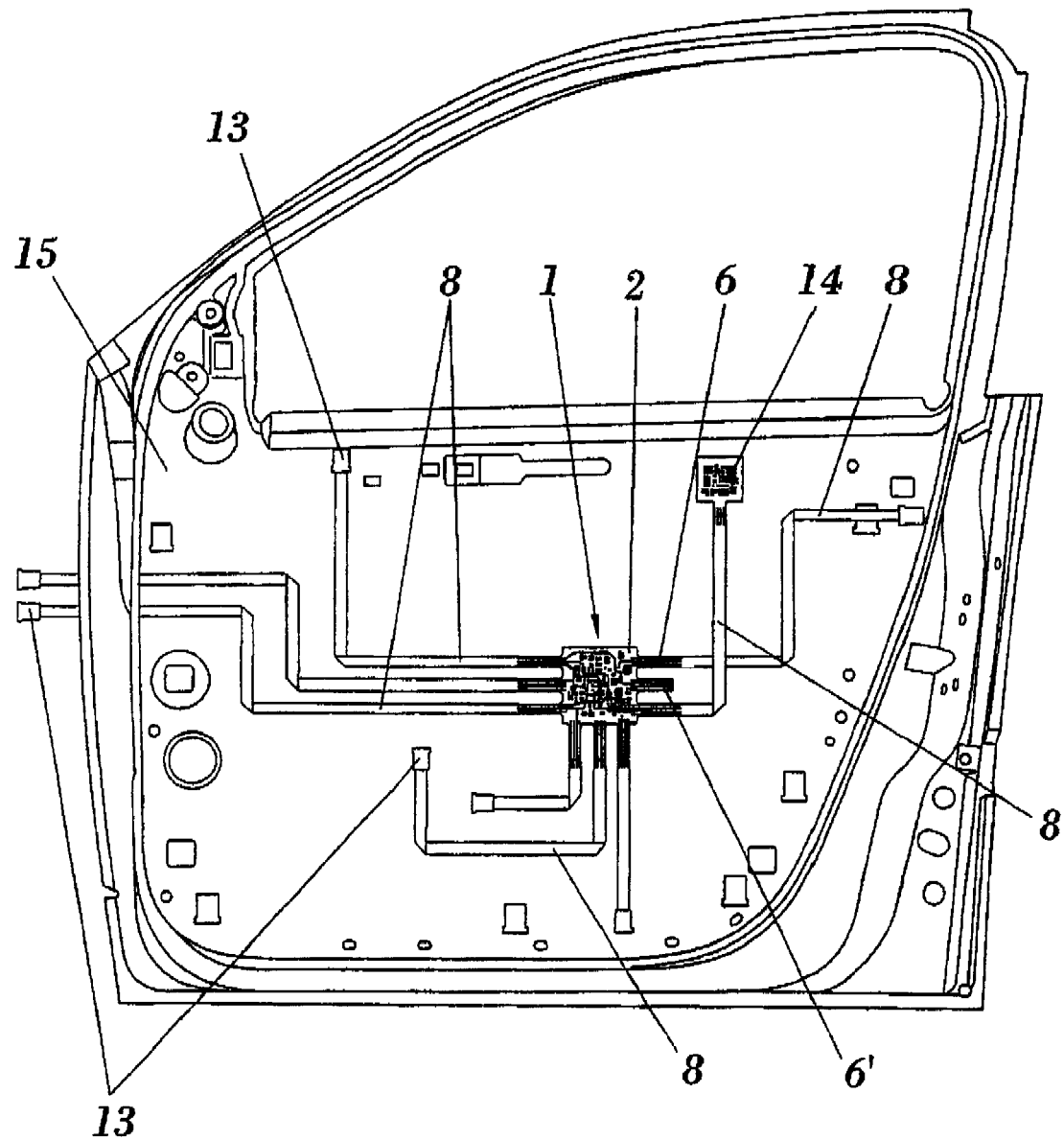
FIG. 8 shows an application of the wiring system of the present invention to a vehicle door.

In FIGS. 1, 7 and 8, described below, the conductive strips in the flat cables (8) have not been depicted for the purpose of clarity. A person skilled in the art will understand that flat cables (8) comprise said conductive strips.

The spacing between the conductive strips (7) of each extension or branch (6) can be equal to the spacing between the conductive strips of the flexible flat cable (8) to which they are connected.

There may be unused conductive strips (7) in one or more extensions or branches (6). One or more extensions or branches (6) may further comprise conductive strips having different widths (6). Alternatively, there may be extensions or branches (6) in which all the conductive strips (7) substantially have the same width.

When an extension or branch (6) is connected with a flexible flat cable (8), if the conductive strips (7) of both of them have a similar width, when such strips are connected they will be substantially aligned.

Finally, FIG. 8 shows an example of a wiring system for its incorporation to a vehicle according to the present invention. More specifically, the wiring system of FIG. 8 is similar to the one previously described with respect to FIG. 7, but it has further been installed in a vehicle door (15). This wiring system may be installed in the body, in a carrying module or in the paneling of the door of the vehicle. One of the cables (8) connected to the flexible board (1) is connected at its opposite end to another flexible board (14) which incorporates electronic components and circuits for the control of any device of the vehicle, such as a keypad for example. Similarly, a wiring system according to that described in the present invention may be incorporated in other parts of a vehicle.

The wiring system of the present invention can be installed in different parts of a vehicle, such as the body of a door, the module carrying a door, the paneling of a door, the body of the ceiling, the paneling of the ceiling, the body of the pillar, the paneling of the pillar, the tray, the seat, the dashboard, etc.

Due to its comfortable design, to the savings of the flexible board due to its use thereof and due to the use of flexible flat cable, which is much less expensive than the flexible board, in those parts in which the flexible board is not strictly necessary, the light weight of the assembly and its easy incorporation and coupling to any area with space problems, the wiring system of the present invention is especially advantageous for being incorporated in places where space and weight are limiting elements, such as in vehicles, and more preferably in vehicle doors, dashboards and ceilings. The system of the present invention further provides great savings in conventional connectors, entailing an economic savings and savings in space and assembly time, as well as the possibility of adapting them to non-planar surfaces.

The wiring system of the present invention therefore solves the clear need to save resources (space, weight, materials, money . . . ) in the wiring integration field.

In view of this description and set of drawings a person skilled in the art will understand that the invention has been described according to some preferred embodiments thereof, but that multiple variations can be introduced in said preferred embodiments without departing from the scope of the invention as claimed.

The invention claimed is:

1. A wiring system comprising:
a flexible printed circuit board comprising:
a surface in turn comprising one or more electrical circuits formed by conductive strips and a plurality of electronic components connected to said conductive strips,
a plurality of extensions or branches extending directly from said surface and also comprising conductive strips;
the wiring system further comprising:
a plurality of flexible flat cables joined to said plurality of extensions or branches, such that an electrical connection is formed between each flexible flat cable and each extension or branch;
wherein:
the electrical connection between each extension or branch and each flexible flat cable is carried out by means of simple connector providing mechanical and electrical connection simultaneously;
at least one of the flexible flat cables has a connector connected at a second end opposite to a first end joined to the corresponding extension or branch for its connection to a vehicle;
at least another of the flexible flat cables has a suitable conventional connector connected at a second end opposite to a first end joined to the corresponding extension or branch for connection a PCB type rigid board;
and wherein the wiring system is designed to be installed in a paneling inside a the vehicle.

2. A wiring system according to claim 1, wherein each of said flexible flat cables is of variable length.

3. A wiring system according to claim 1 or claim 2, wherein at least one of said flexible flat cables has a flexible printed circuit board connected at the end opposite to the end joined to the corresponding extension or branch.

4. A wiring system according to claim 1, wherein at least one extension or branch is not connected to any flexible flat cable.

5. A wiring system according to claim 1, wherein the electrical connection between each extension or branch and each flexible flat cable is carried out by means of a method chosen from the following group: crimping, welding, gluing, and the combination of any of the latter.

6. A wiring system according to claim 5, wherein said electrical connection between each extension or branch and each flexible flat cable is protected by a layer of an insulating element.

7. A wiring system according to claim 1, wherein the width of at least one extension or branch is equal to the width of the corresponding flexible flat cable.

8. A wiring system according to claim 1, wherein the spacing between the conductive strips of each extension or branch is equal to the spacing between the conductive strips of the corresponding flexible flat cable.

9. A wiring system according to claim 1, wherein there are unused conductive strips in at least one extension or branch.

10. A wiring system according to claim 1, wherein at least one extension or branch comprises conductive strips having different widths.

11. A wiring system according to claim 1, wherein all the conductive strips in at least one extension or branch substantially have the same width.

12. A wiring system according to claim 1, wherein when at least one extension or branch is connected with a flexible flat cable the connected conductive strips have the same width.

13. A wiring system according to claim 1, wherein the flexible printed circuit board is encapsulated in an insulating element.

14. A wiring system according to claim 1, designed to be installed inside a vehicle.

15. A wiring system according to claim 14, designed to be installed in the paneling of a vehicle door, pillar or ceiling.

16. A wiring system according to claim 14, designed to be installed in a tray, a dashboard, a seat, or a module carrying a vehicle door.

17. A vehicle door internally comprising a wiring system according to claim 1.

* * * * *